(12) United States Patent
Cook et al.

(10) Patent No.: US 8,086,208 B2
(45) Date of Patent: Dec. 27, 2011

(54) PASSIVE WIRELESS RECEIVER

(75) Inventors: Benjamin Walter Cook, Berkeley, CA (US); Axel Dominique Berny, Berkeley, CA (US)

(73) Assignee: Passif Semiconductor Corp., San Mateo, CA (US)

( * ) Notice: Subject to any disclaimer, the term of this patent is extended or adjusted under 35 U.S.C. 154(b) by 498 days.

(21) Appl. No.: 12/329,403

(22) Filed: Dec. 5, 2008

(65) Prior Publication Data
US 2010/0144305 A1    Jun. 10, 2010

(51) Int. Cl.
*H04B 1/26* (2006.01)
(52) U.S. Cl. .......................... 455/323; 455/293
(58) Field of Classification Search .................. 327/290, 327/292, 293, 323, 343.1; 455/290, 292, 455/293, 323, 343.1
See application file for complete search history.

(56) References Cited

U.S. PATENT DOCUMENTS

| | | | |
|---|---|---|---|
| 5,742,213 A | 4/1998 | Reynolds | |
| 6,653,885 B2 | 11/2003 | Wu et al. | |
| 7,203,472 B2 | 4/2007 | Seppinen et al. | |
| 7,356,317 B2 * | 4/2008 | Xu et al. | 455/130 |
| 7,474,885 B2 * | 1/2009 | Shen et al. | 455/324 |
| 7,599,675 B2 * | 10/2009 | Mu et al. | 455/240.1 |
| 7,865,164 B2 * | 1/2011 | Xu et al. | 455/323 |
| 7,899,426 B2 * | 3/2011 | Tasic et al. | 455/286 |
| 2006/0141976 A1 | 6/2006 | Rohde et al. | |
| 2008/0181340 A1 | 7/2008 | Maxim | |

OTHER PUBLICATIONS

Low-power 2.4-GHz Transceiver with passive RX front-end and 400-mV supply (Cook et al) IEEE Journal of Solid-State Circuits, vol. 41, No. 12, Dec. 2006.

* cited by examiner

*Primary Examiner* — Jeffrey Zweizig
(74) *Attorney, Agent, or Firm* — Gary R. Stanford

(57) ABSTRACT

A passive wireless receiver to receive an input signal and passively process the input signal to generate an output signal. An embodiment of the receiver includes an input circuit, a dynamic switching circuit, and a switch signal generator. The input circuit is configured to receive an input signal and produce a first output signal. The input circuit includes a passive network configured to condition the input signal. The dynamic switching circuit is configured to perform frequency translation on the first output signal. The switch signal generator is configured to drive the dynamic switching circuit to activate and deactivate the dynamic switching circuit at a sampling frequency that is controlled and stabilized by a frequency control circuit.

40 Claims, 16 Drawing Sheets

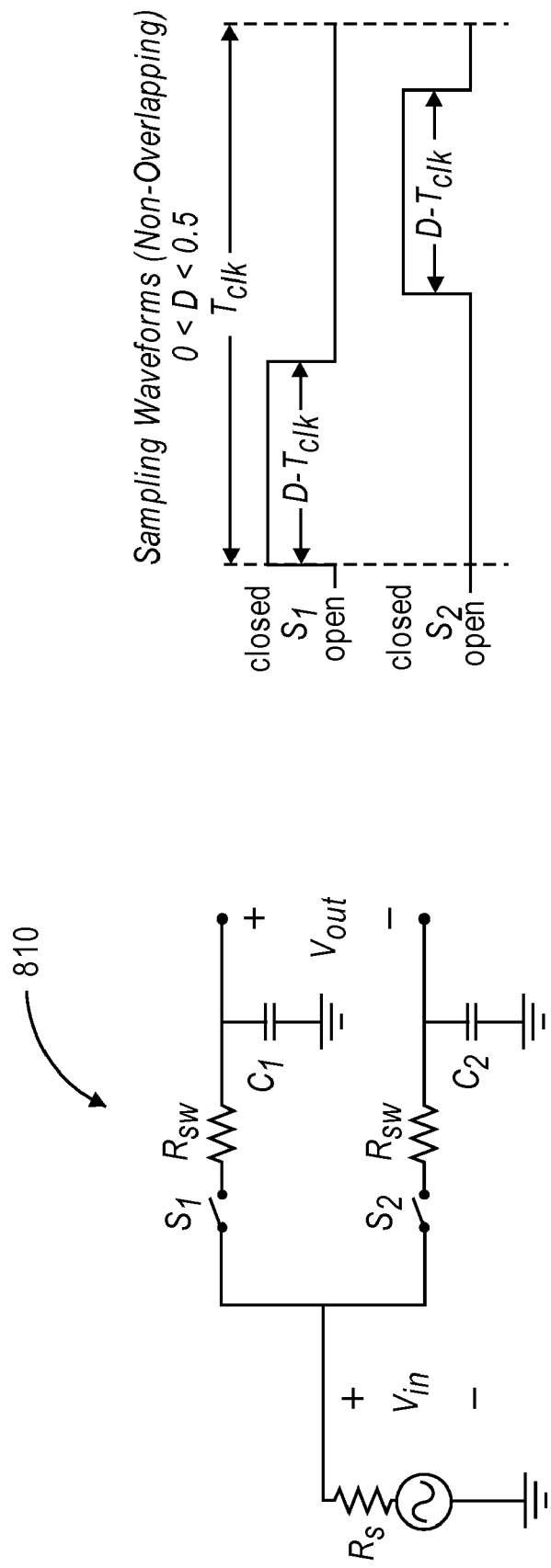

PASSIVE WIRELESS RECEIVER

BACKGROUND

Receiver systems typically receive an input signal and generate one or more output signals by performing various processing of the input signal. Different receiver system designs offer varying performance characteristics depending on the specific application of the receiver system. Example performance characteristics include frequency selectivity, power consumption of the receiver system, noise figure, one decibel compression point ($P_{1dB}$), third-order intercept point (IP3), dynamic range, and immunity to signal corruption within the receiver system.

Conventional receiver systems provide amplification and frequency translation of an input signal while dissipating significant energy from the available power source, especially components appearing early in the RF signal path (e.g., closest to the antenna). Such receivers use active components, such as low noise amplifiers (LNA) and/or current-commutating mixers, in the RF signal path to amplify and/or translate the frequency of the input signals provided by the antenna. The critical performance metrics for these active components, such as noise figure (NF) and linearity (often specified by $P_{1db}$ and/or IP3), have fundamental limits dependent on the power consumption of the active component and are generally improved by increasing the bias current and/or available voltage headroom. These power-performance tradeoffs lead to high current consumption when high performance is desired or, equivalently, poor performance when low-power is desired.

In contrast, passive components (e.g., inductors, capacitors, resistors and switches) offer high intrinsic linearity and consume little or no power. Some passive networks, such as LC resonators constructed with high quality factor components, can achieve substantial voltage gain with low loss and hence, low noise figure. In addition, highly linear, low noise frequency translation can be achieved using passive switches and capacitors (e.g., a passive mixer). In a passive mixer, the signal path remains passive while minimal power is spent activating and deactivating the constituent switches. Furthermore, advances in process technology may bring lower resistance switches that require less energy to activate and deactivate, improving the power/performance tradeoffs in the passive mixer. Thus, passive circuits offer an opportunity to achieve equivalent functionality to conventional active components in a receiver front-end with dramatically lower power consumption.

A known wireless transceiver using a substantially passive RF receiver signal path was described by the authors in IEEE Journal of Solid-State Circuits, Vol. 4, No. 12, December 2006, "Low-Power 2.4-GHz Transceiver With Passive RX Front-End and 400-mV Supply", Ben W. Cook et al. This publication discloses a basic receiver including a passive voltage gain network driven by an external antenna and directly followed by a passive switching mixer providing frequency translation to baseband. This receiver provided signal amplification and frequency translation while consuming very little power. Due to the relaxed performance requirements of the intended application, the disclosed receiver was conceived so as to minimize power consumption and support operation from very low supply voltages. As a result, and as pointed out in the publication, robustness and performance were not critical to the intended application, whereas minimizing complexity and power consumption were the focal points of that work.

The passive voltage gain network disclosed in the publication had a fixed center frequency and a fixed voltage gain. The lack of gain control prevented the receiver from being able to accommodate a wide range of input signals, as is generally required for wireless data applications. In the published work, the passive switching mixer was driven directly by a free-running voltage controlled oscillator (VCO). Thus, the sampling frequency of the receiver was neither well-defined nor stabilized and the receiver was not able to automatically tune to and receive signals from different RF communication channels. Secondly, since there was no isolation between the VCO and the mixer, the sampling frequency of the mixer was susceptible to corruption by pulling due to the coupling of RF input signals. Furthermore, the sinusoidal shape of the VCO waveforms driving the mixer, coupled with a requirement of non-overlap between driving phases, degraded the linearity and noise performance achieved by the receiver. Lastly, the passive switching mixer utilized in the publication could not achieve voltage gain greater than 0 dB, thus limiting the overall RF gain and thereby impairing the achievable sensitivity for a given power budget.

Many applications favor a receiver system that consumes as little energy as possible. For example, handheld wireless data devices generally favor long battery lifetime yet must maintain adequate performance to comply with a given wireless communication standard. In these applications, a receiver system that meets performance specifications and provides signal amplification and frequency translation using low power passive circuitry, rather than current consuming active components, is desirable.

BRIEF DESCRIPTION OF THE DRAWINGS

Throughout the description, similar reference numbers may be used to identify similar elements.

DETAILED DESCRIPTION

Figure 1:
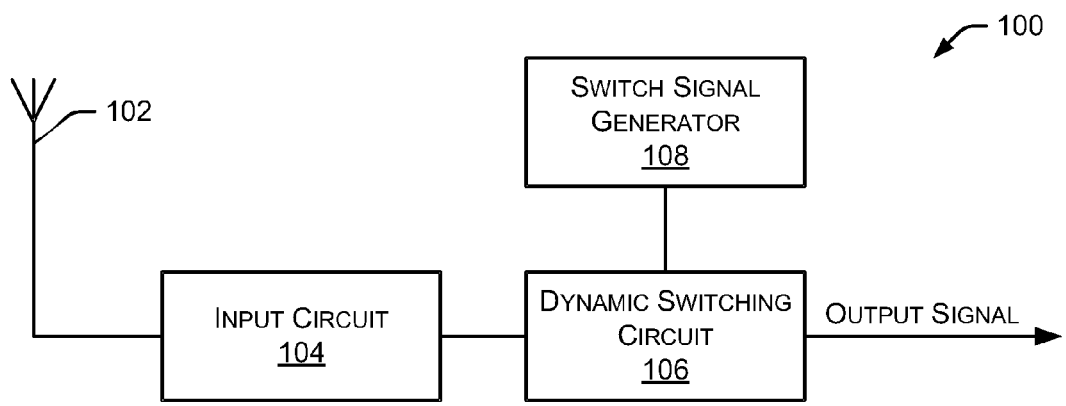
FIG. 1 depicts a block diagram of an embodiment of a passive wireless receiver.

FIG. 1 depicts a block diagram of an embodiment of a passive wireless receiver 100. Passive wireless receiver 100 receives an input signal from an antenna 102 and generates one or more output signals by performing signal processing on the input signal, including frequency translation to a second frequency, using a passive signal path from an antenna input to the output signal terminals. A typical embodiment of passive wireless receiver 100 achieves passive voltage amplification and frequency translation to a much lower frequency (e.g., downconversion to baseband). The output frequency of passive wireless receiver 100 is a function of the input signal frequency and the frequency of an internally generated switching signal described herein. The output signal of passive wireless receiver 100 may be communicated to other components that perform additional signal processing, such as conventional analog baseband circuits. The components included in passive wireless receiver 100 do not add power to the output signal. Instead, the power contained in the output signal is substantially composed of the input signal power received by the antenna.

An input signal is received by antenna 102, which is a passive component that captures ambient electromagnetic signals. These ambient electromagnetic signals typically include the signal of interest as well as background noise and other signals. Antenna 102 may be a wide band antenna or a narrow band antenna, may be single-ended or differential, and may have any impedance value. A typical impedance value for antenna 102 is 50 ohms. The input signal received by antenna 102 is provided to an input circuit 104.

Passive wireless receiver 100 generates one or more analog outputs by performing various analog processing operations on the input signal using input circuit 104 and a dynamic switching circuit 106. Input circuit 104 is a passive electrical circuit with an input coupled to antenna 102 and an output that is sampled by dynamic switching circuit 106. As discussed in greater detail below, input circuit 104 typically includes a resonant circuit, such as an LC circuit or an electromechanical circuit. Input circuit 104 conditions the input signal, typically by providing voltage gain, impedance matching, and filtering prior to frequency translation by dynamic switching circuit 106.

Dynamic switching circuit 106 is a passive switching analog circuit that provides the output signal of passive wireless receiver 100. Dynamic switching circuit 106 performs frequency translation on the output signal of input circuit 104 based on the sampling frequency provided by a switch signal generator 108 described herein. As discussed in greater detail below, dynamic switching circuit 106 may perform additional analog signal processing, such as filtering, signal summation, or decimation. Dynamic switching circuit 106 samples the output signal of input circuit 104 using one or more switches and/or capacitors.

Switch signal generator 108 is coupled to create and deliver one or more drive signals to dynamic switching circuit 106. The drive signals activate and deactivate the switches in dynamic switching circuit 106. Thus, the output of switch signal generator 108 determines the sampling frequency of dynamic switching circuit 106. Switch signal generator 108 also performs waveform shaping, isolation, and automatic frequency tuning operations. Waveform shaping includes modification of the switch signal waveform characteristics such as amplitude, harmonic content, and the degree of overlap between phases. The automatic frequency tuning operation provides a stable sampling frequency, thereby tuning passive wireless receiver 100 to the appropriate communication channel. Isolation prevents the sampling frequency of passive wireless receiver 100 from being affected by signals received by antenna 102 or other sources of interference.

In a particular embodiment of passive wireless receiver 100, the input signal has a significantly higher frequency than the output signal. In this embodiment, dynamic switching circuit 106 performs frequency translation on the input signal in an RF (radio frequency) communication channel to a lower frequency (e.g., baseband). In alternate embodiments, the input signal and output signal may have any associated frequency.

Figure 2:
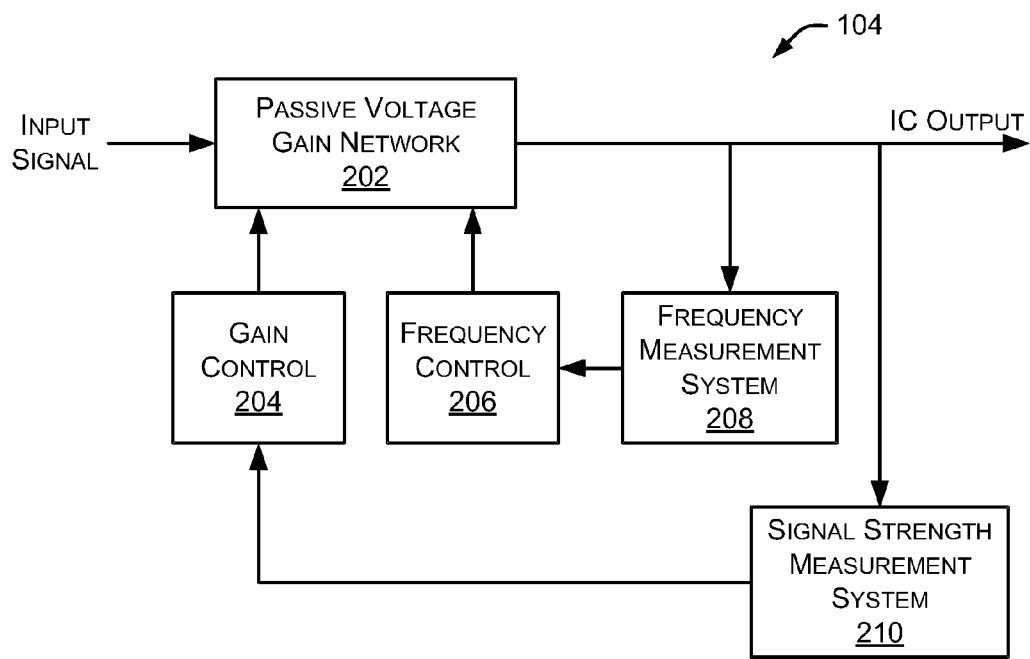
FIG. 2 depicts an embodiment of an input circuit included in a passive wireless receiver.

FIG. 2 depicts an embodiment of input circuit 104 included in passive wireless receiver 100. Input circuit 104 provides frequency selectivity as well as the ability to handle large incoming signals (including both desired signals and interfering signals). Gain control provided by input circuit 104 impacts the dynamic range of passive wireless receiver 100. To improve the ability of passive wireless receiver 100 to tolerate a wide range of incoming signal power levels, the receiver has the ability to automatically adjust its gain at one or more locations along the signal path.

Input circuit 104 includes a passive voltage gain network 202 that receives an input signal from antenna 102. Passive voltage gain network 202 generates an output signal (labeled "IC Output"), which is communicated to dynamic switching circuit 106 shown in FIG. 1. Additionally, the output signal is communicated to a signal strength measurement system 210. Frequency measurement system 208 measures the center frequency (e.g., resonant frequency) of the network and generates frequency control signals that are communicated to a frequency control 206, which controls the frequency response of passive voltage gain network 202. The frequency control signals cause passive voltage gain network 202 to adjust its center frequency, as necessary. In a particular embodiment, frequency measurement system 208 and frequency control 206 detect and adjust the center frequency of passive voltage gain network 202 for improved performance.

Signal strength measurement system 210 measures the output signal's amplitude and/or power level and generates gain control signals that are communicated to a gain control 204, which controls the gain associated with passive voltage gain network 202. The gain control signals cause passive voltage gain network 202 to adjust its gain, as necessary. In a particular embodiment, passive voltage gain network 202 can have positive, zero or negative (in dB) voltage gain in certain situations.

The measurement and control components shown in FIG. 2 (e.g., components 204, 206, 208 and 210) can be activated on a continuous basis or on an intermittent basis. Additionally, the frequency and gain can be adjusted in a continuous analog manner or in a discrete-step manner. With the exception of passive voltage gain network 202, which is implemented with passive components, the components shown in FIG. 2 can be implemented using passive and/or active electronic components.

Although not shown in FIG. 2, one or more optional passive components may process the input signal before passive voltage gain network 202 receives the input signal. These optional components include, for example, one or more interface networks and/or one or more passive signal filters. Interface networks include balun transformers and matching networks. Passive signal filters include ceramic filters and surface acoustic wave (SAW) filters.

Figure 3:
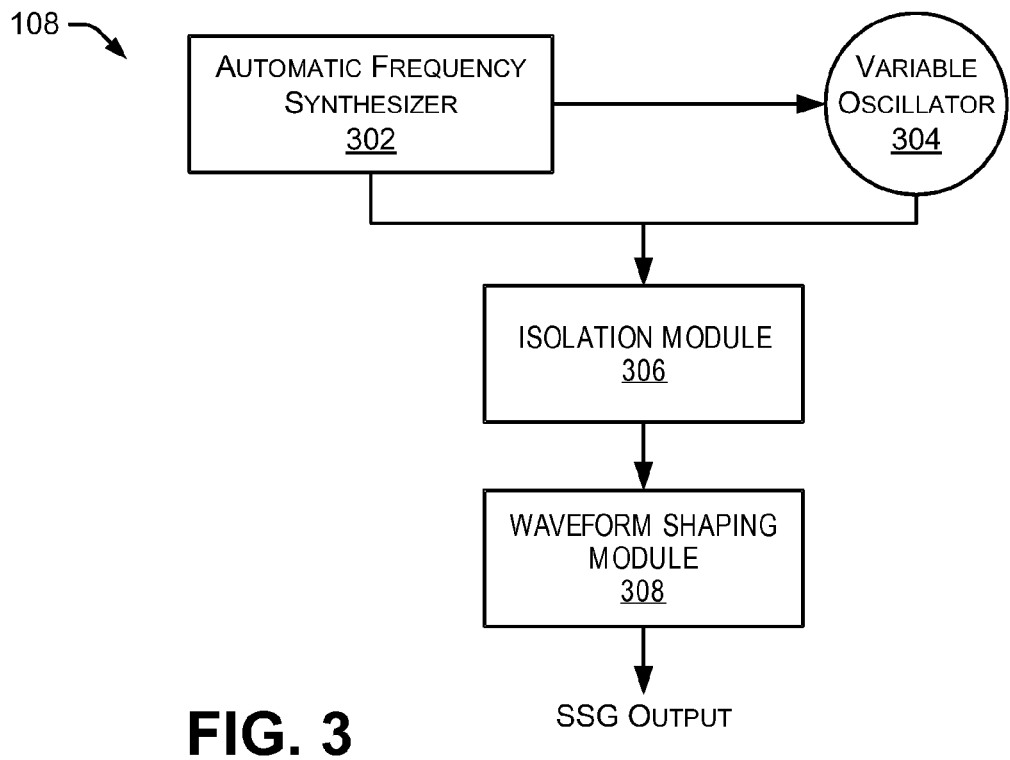
FIG. 3 depicts an embodiment of a switch signal generator included in a passive wireless receiver.

FIG. 3 depicts an embodiment of switch signal generator 108 included in passive wireless receiver 100. Switch signal generator 108 generates switching signals (labeled SSG Output) that activate and deactivate switches in dynamic switching circuit 106. The frequency of the switching signals is derived from the output of a variable oscillator 304. The frequency of variable oscillator 304 is controlled and stabilized to provide proper operation of the overall system. To provide the necessary frequency control and stabilization, an automatic frequency synthesizer 302 improves the operation of variable oscillator 304. Without this frequency control and stabilization, the frequency of variable oscillator 304 would be subject to its intrinsic frequency accuracy and stability in response to factors such as time, temperature, manufacturing variability, and unwanted interfering signals. Automatic frequency synthesizer 302 is capable of controlling the variable oscillator's 304 output frequency and/or phase with greater accuracy and stability than the variable oscillator operating without such automatic frequency synthesizer. Automatic frequency synthesizer 302 automatically corrects for frequency and phase errors caused by disturbances in variable oscillator 304. In particular embodiments, automatic frequency synthesizer 302 is capable of automatically tuning to a new frequency based on one or more control signals.

Switching signal generator 108 also includes an isolation module 306 and a waveform shaping module 308. Isolation module 306 isolates the variable oscillator 304 from the switching signals and other unwanted signals such as signals present at the output of passive voltage gain network 202, and other sources of noise such as disturbances on the power source introduced by the switching activity of waveform shaping module 308. Waveform shaping module 308 shapes the waveform associated with the switching signals, such as the waveform amplitude, harmonic content, and degree of overlap between phases. Additional details regarding the implementation of isolation module 306 and waveform shaping module 308 are discussed herein.

Figure 4:
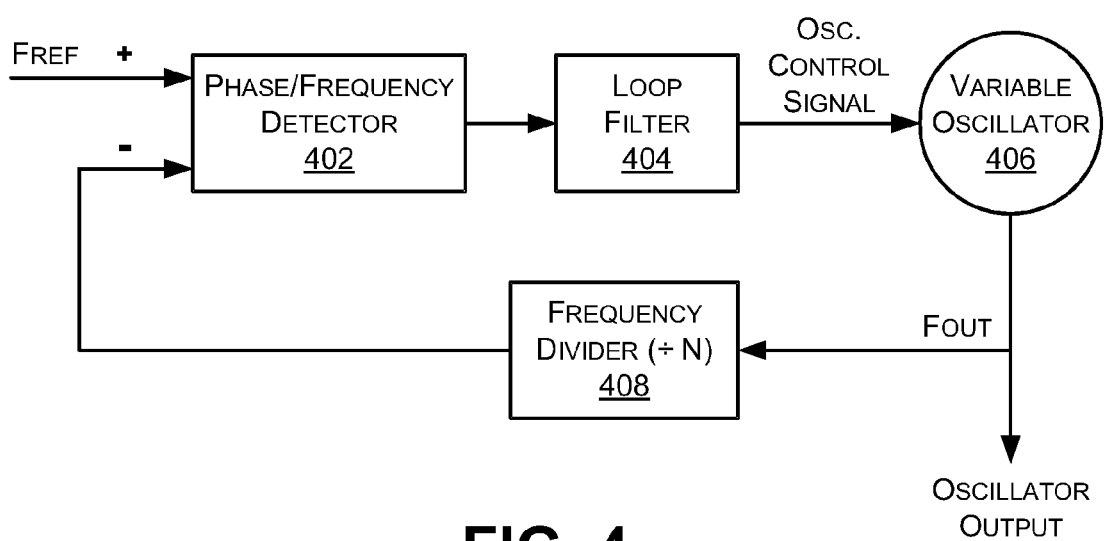
FIG. 4 depicts an embodiment of a phase locked loop included in a switch signal generator.

FIG. 4 depicts an embodiment of a phase locked loop included in switch signal generator 108. The components shown in FIG. 4 implement the functions of automatic frequency synthesizer 302 and variable oscillator 304 discussed above with respect to FIG. 3. A phase/frequency detector 402 receives a reference frequency signal (labeled Fref) and a feedback signal from a frequency divider 408. The Fref signal is typically derived from a highly accurate and stable fixed frequency reference signal, such as a reference signal from a crystal resonator oscillator. In operation, phase/frequency detector 402 may perform phase detection and/or frequency detection. The output of phase/frequency detector 402 is provided to a loop filter 404, which generates an oscillator control signal. The oscillator control signal is received by a variable oscillator 406, which generates an oscillator output signal (labeled Fout). The oscillator output signal is also provided to frequency divider 408, which performs a divide by N operation. The output of frequency divider 408 is provided to an input of phase/frequency detector 402.

In the embodiment of FIG. 4, when operating in steady state, the oscillator output signal (Fout) is defined as Fout=N*Fref, where Fref is the reference frequency signal. Frequency divider 408 provides a well-defined programmable frequency modulus N that can be implemented as an integer number or as a fractional number. The frequency of output signal Fout is controlled by changing the value of N used in frequency divider 408.

FIG. 4 represents a particular implementation of an automatic frequency synthesizer. Alternate implementations of the automatic frequency synthesizer include a delay locked loop configuration or a frequency locked loop configuration.

Figure 5A:
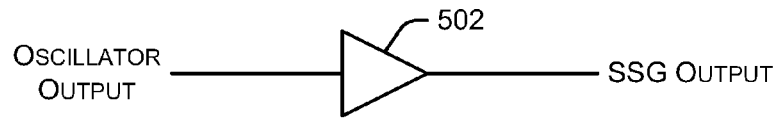
FIGS. 5A-5E depict several embodiments of circuits that perform isolation and waveform shaping included in a switch signal generator.

FIGS. 5A-5E depict several embodiments of circuits that perform isolation and waveform shaping included in a switch signal generator. FIG. 5A illustrates an example buffer 502 that performs isolation. Buffer 502 receives an oscillator output signal and generates a switching signal (labeled SSG Output). Buffer 502 is capable of performing one or more of the following functions: signal isolation, signal buffering, signal shielding, and power/ground separation, bypassing, or decoupling.

Figure 5B:
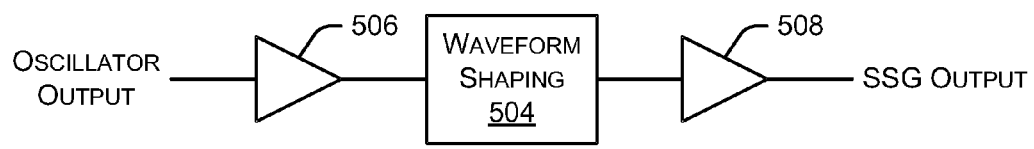

FIG. 5B illustrates an embodiment of a system that performs waveform shaping with optional buffering. A waveform shaping module 504 receives an oscillator output signal and generates a switching signal (SSG Output). One or more optional buffers 506 and 508 may be coupled to the input and/or output of waveform shaping module 504. Waveform shaping module 504 is capable of conditioning various characteristics of its output signals, such as signal amplitude, signal waveform shape, phase properties, and timing properties. Additionally, waveform shaping module 504 can provide one or more of the following: signal isolation, signal buffering, signal shielding, and power/ground separation, bypassing, or decoupling.

Figure 5C:
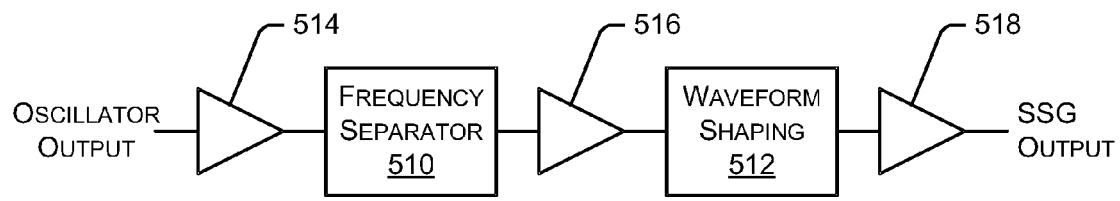

FIG. 5C illustrates an embodiment of a system that performs frequency separation with optional waveform shaping and optional buffering. A frequency separator 510 receives an oscillator output signal and generates a switching signal (SSG Output). An optional waveform shaping module 512 may further modify the SSG Output. Additionally, one or more optional buffers 514, 516, and 518 may be coupled to the input and/or output of frequency separator 510. Frequency separator 510 provides frequency separation such that the variable oscillator and the dynamic switching circuit operate at different frequencies, thereby improving isolation between the variable oscillator and the dynamic switching circuit.

Frequency separator 510 can be implemented as a frequency divider, a frequency mixer, or a combination of a frequency divider and a frequency mixer. When frequency separator 510 is used with optional waveform shaping module 512 and one or more buffers (e.g., 514, 516, and 518), the system further improves signal isolation and provides control of the desired signal amplitude, signal waveform shape, and signal frequency, phase, and time properties.

Figure 5D:
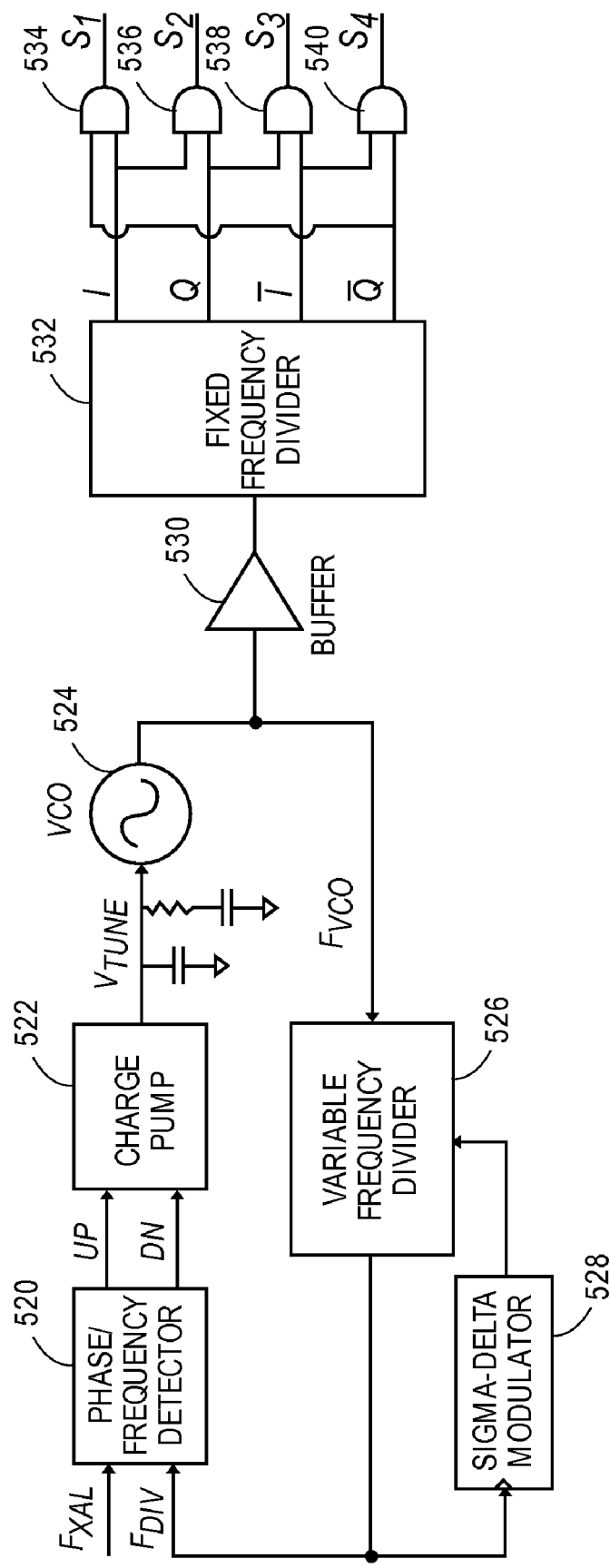
Figure 5E:
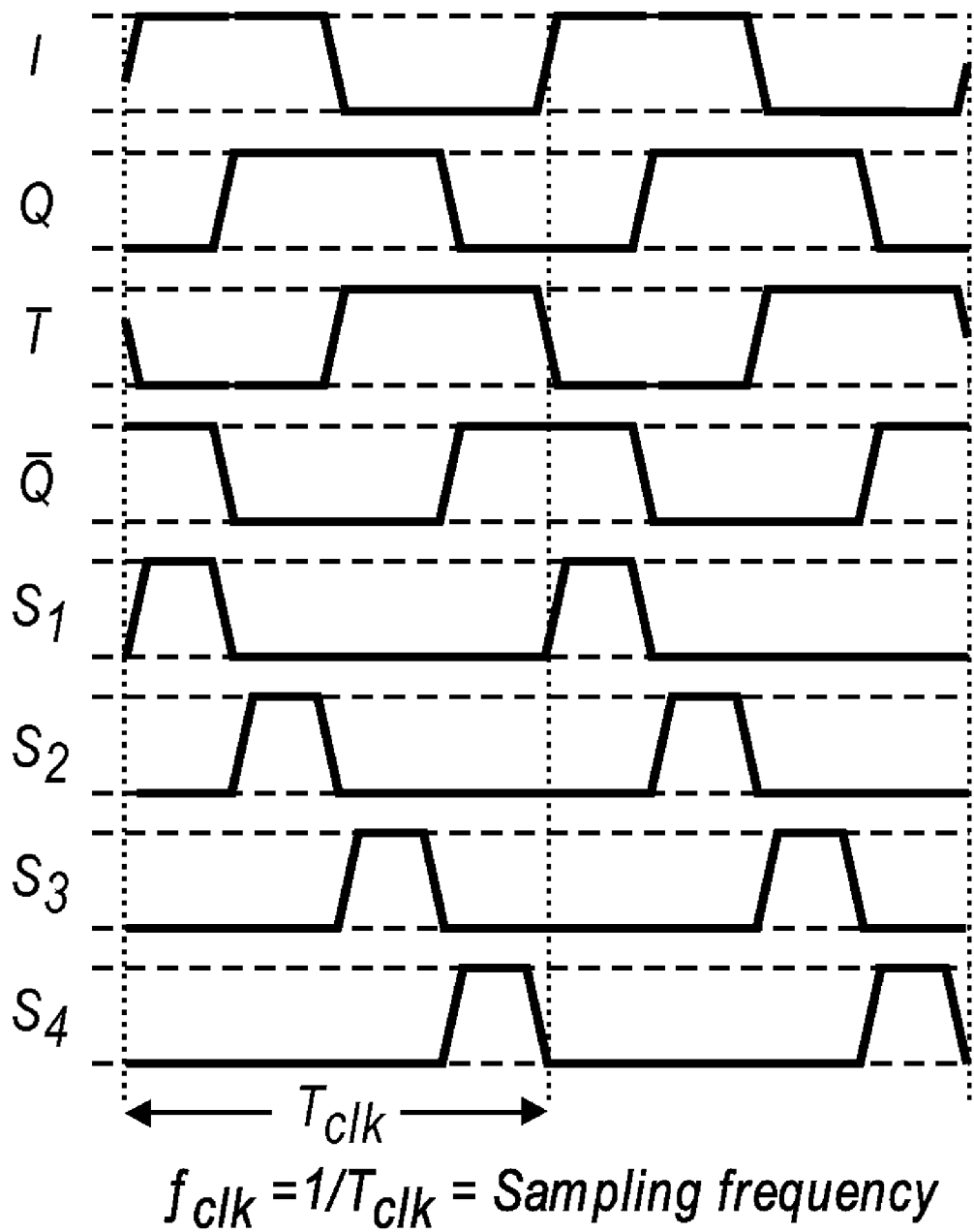

FIG. 5D illustrates a particular implementation of a complete switch signal generator with automatic frequency tuning, waveform shaping, and isolation via frequency separation and buffering. The embodiment of FIG. 5D includes a phase/frequency detector 520, a charge pump 522, a variable oscillator 524, a variable frequency divider 526, and a sigma-delta modulator 528. Collectively, components 520, 522, 524, 526, and 528 represent a phase-locked loop that implements automatic frequency tuning.

A buffer 530 receives the output signal of variable oscillator 524 and provides isolation between the variable oscillator and the switch signal generator output. A fixed frequency divider 532 divides the output frequency of variable oscillator 524, providing additional isolation, and produces four outputs with a quadrature phase relationship as illustrated in the timing diagram of FIG. 5E. Logic gates 534, 536, 538, and 540 form a waveform shaping circuit that receives the four quadrature outputs of fixed frequency divider 532 and produces four non-overlapping pulses with a quadrature phase relationship. As described herein, many passive dynamic switching networks utilize non-overlapping pulses to achieve improved performance.

Figure 6:
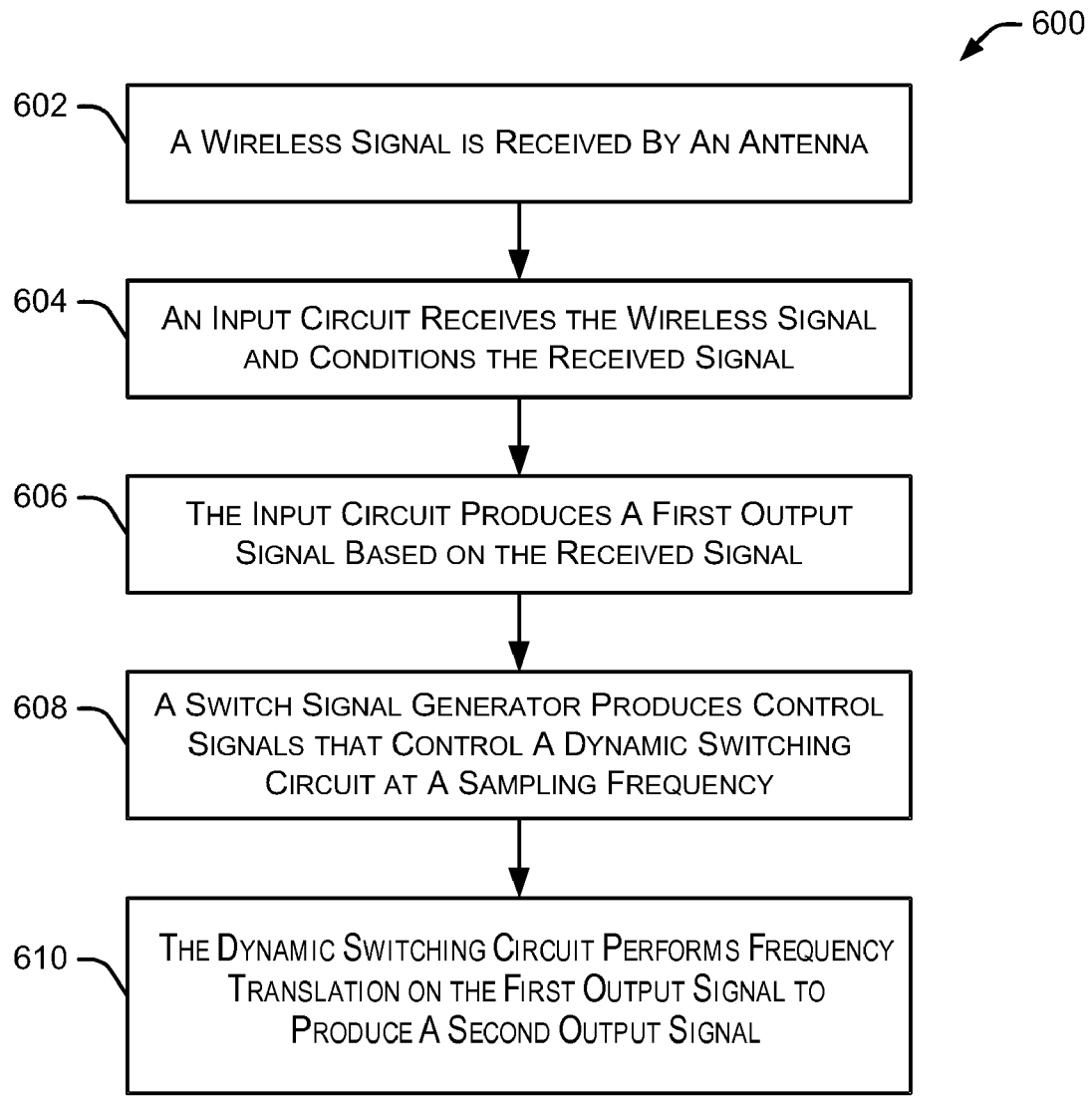
FIG. 6 depicts a flow diagram of an example method for processing a received wireless signal.

FIG. 6 depicts a flow diagram of an example method 600 for processing a received wireless signal. Initially, a wireless signal is received by an antenna (block 602). An input circuit receives the wireless signal and conditions the received signal (block 604). The input circuit produces a first output signal based on the received signal (block 606). A switch signal generator produces one or more control signals that control one or more switches in a dynamic switching circuit at a sampling frequency (block 608). The dynamic switching circuit performs frequency translation on the first output signal to produce a second output signal (block 610). The second output signal is then communicated to other systems or components that utilize the output signal.

FIGS. 7A-7G depict several embodiments of input circuits that may be included in a passive wireless receiver. These input circuits are examples of input circuit 104 shown in FIG. 1. As discussed herein, example input circuits are characterized by various attributes, such as the nature of the input/output (e.g., single-ended or differential), the frequency selectivity (e.g., wideband, tuned resonant, or tuned non-resonant), and the achievable passive voltage gain.

Figure 7A:
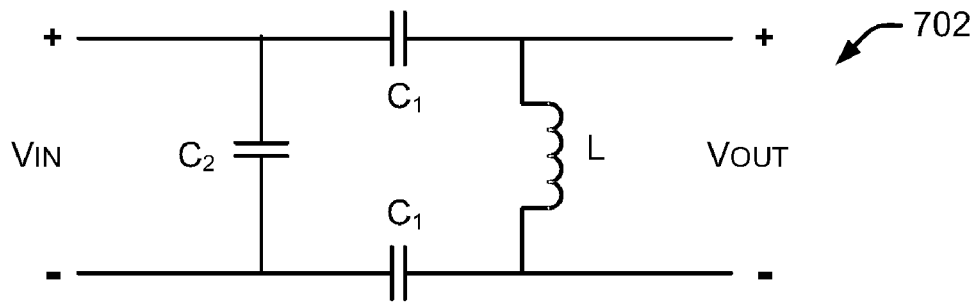
FIGS. 7A-7G depict several embodiments of input circuits that can be included in a passive wireless receiver.

FIG. 7A illustrates an embodiment of a differential tapped capacitor resonant circuit 702. Circuit 702 has a differential input (Vin) and a differential output (Vout), is a tuned resonator, and is capable of significant passive voltage gain. The center frequency ($f_0$) of circuit 702 is determined by the value of inductor L and the series combination of capacitors $C_1$ and $C_2$. The center frequency ($f_0$) is given by the following equation:

$$\omega_0 = 2\pi f_0 = \sqrt{\frac{2C_1 + C_2}{L \cdot C_1 \cdot C_2}}$$

Figure 7B:
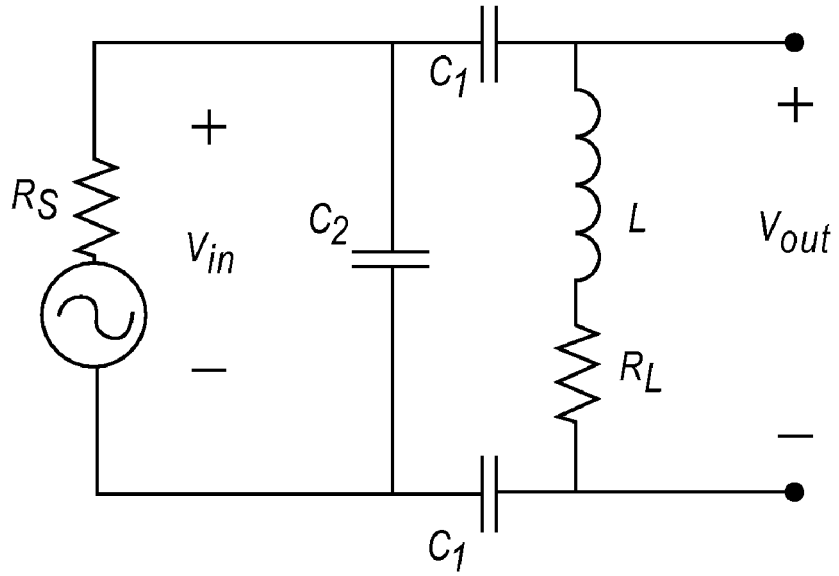

For a particular frequency, the gain of circuit 702, and the circuit's quality factor (Q) can be increased by increasing the relative size of $C_2$ to $C_1$. To calculate the voltage gain ($A_v$), output impedance ($R_o$), and noise factor (F) of circuit 702, a circuit model incorporating the losses of the resonator and the impedance of the input source is used. An example circuit model is illustrated in FIG. 7B. For typical embodiments of circuit 702, the predominant sources of loss in the circuit are the resistance of the input source ($R_S$) and series resistance of the inductor ($R_L$). In other embodiments, intrinsic losses in the capacitors may be significant as well. To simplify the following equations, an equivalent capacitor quality factor ($Q_C$) is defined that includes the losses contributed by source resistance ($R_S$), where $\omega$ is radian frequency. The value of $Q_C$ is calculated as follows.

$$Q_C = \omega \cdot R_S \frac{C_2}{C_1}(2C_2 + C_1) + \frac{2}{\omega \cdot R_S C_1}$$

The output impedance of circuit 702 at resonance is real (e.g., no imaginary component) and its magnitude is given by the following equation.

$$R_o|_{\omega=\omega_o} = \omega_o L \frac{Q_C Q_L}{Q_C + Q_L}$$

The voltage gain ($A_v$) of circuit 702 is a function of frequency and is maximum at the center frequency of the network.

$$|A_V(\omega_o)| \approx \frac{2Q_C Q_L}{Q_C + Q_L}\sqrt{\frac{\omega_o L}{R_S Q_C}}$$

The noise factor of circuit 702 at the center frequency is given by the following equation.

$$F|_{\omega=\omega_o} = 1 + \frac{Q_C}{Q_L}$$

Thus, noise factor improves with higher inductor quality factors. Similarly, voltage gain favors higher inductor quality factors as well as higher inductance values. Other resonant LC networks described herein feature analogous dependences on inductance and quality factor. Circuit 702 can be incorporated into an integrated circuit (IC) or other component. Circuit 702 can be tuned over a wide range of frequencies and voltage gains. Alternate embodiments of circuit 702 provide a single-ended input/output instead of a differential input/output, or may provide single-ended to differential conversion.

Figure 7C:
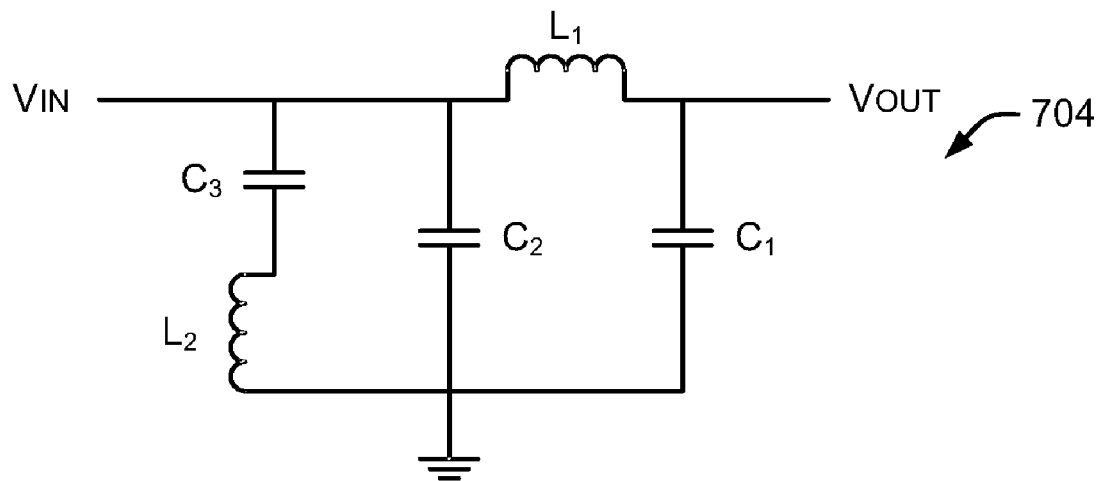

FIG. 7C illustrates an embodiment of a circuit 704 referred to as a resonant pi-network with an LC trap. Circuit 704 has a single-ended input (Vin) and a single-ended output (Vout), is a tuned resonator, and is capable of significant voltage gain. The "pi-network" portion of circuit 704 includes inductor $L_1$ and capacitors $C_1$ and $C_2$. The "LC trap" portion of circuit 704 includes inductor $L_2$ and capacitor $C_3$. The LC trap functions as a sharp bandstop filter that is typically placed at higher frequencies than the passband and often at harmonics of the passband. The stopband provided by the LC trap is centered at the series resonant frequency of $L_2$ and $C_3$. In alternate embodiments, multiple LC traps may be connected across the circuit input.

If the series resonance of the circuit is at a higher frequency than the passband, then when the frequency is inside the passband, the LC trap will present a capacitive impedance which adds in parallel with $C_2$ and, therefore, affects the center frequency of the passband. Circuit 704 can be tuned over a wide range of frequencies and voltage gains, and offers increased rejection in the vicinity of the resonant frequency of the LC trap.

Figure 7D:
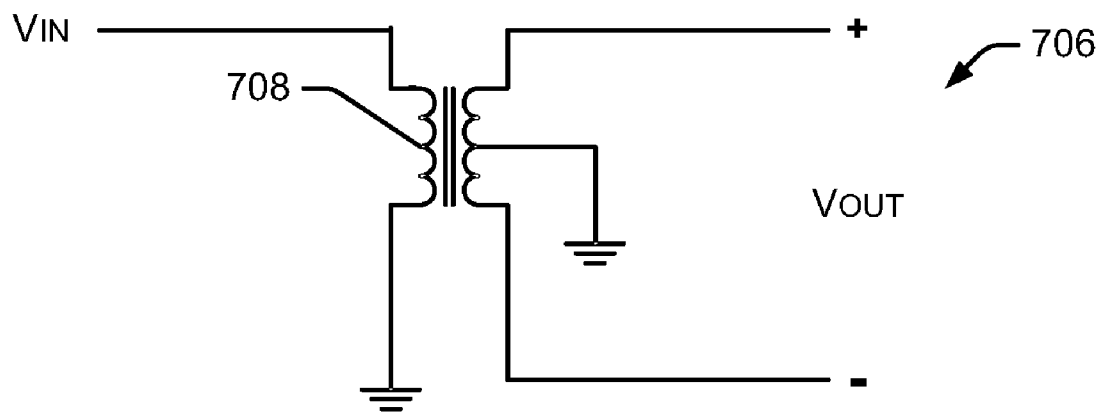

FIG. 7D illustrates an embodiment of a circuit 706 referred to as a wideband balun step-up transformer. Circuit 706 has a single-ended input (Vin) and a differential output (Vout). The circuit is wideband instead of tuned and may be configured to provide significant voltage gain. The voltage gain of circuit 706 is determined by the ratio n:1 associated with a transformer 708. Circuit 706 is particularly useful in wideband applications where a differential output is desired. Circuit 706 can be used alone or in combination with a differential-input passive circuit, such as circuit 702 shown in FIG. 7A.

Figure 7E:
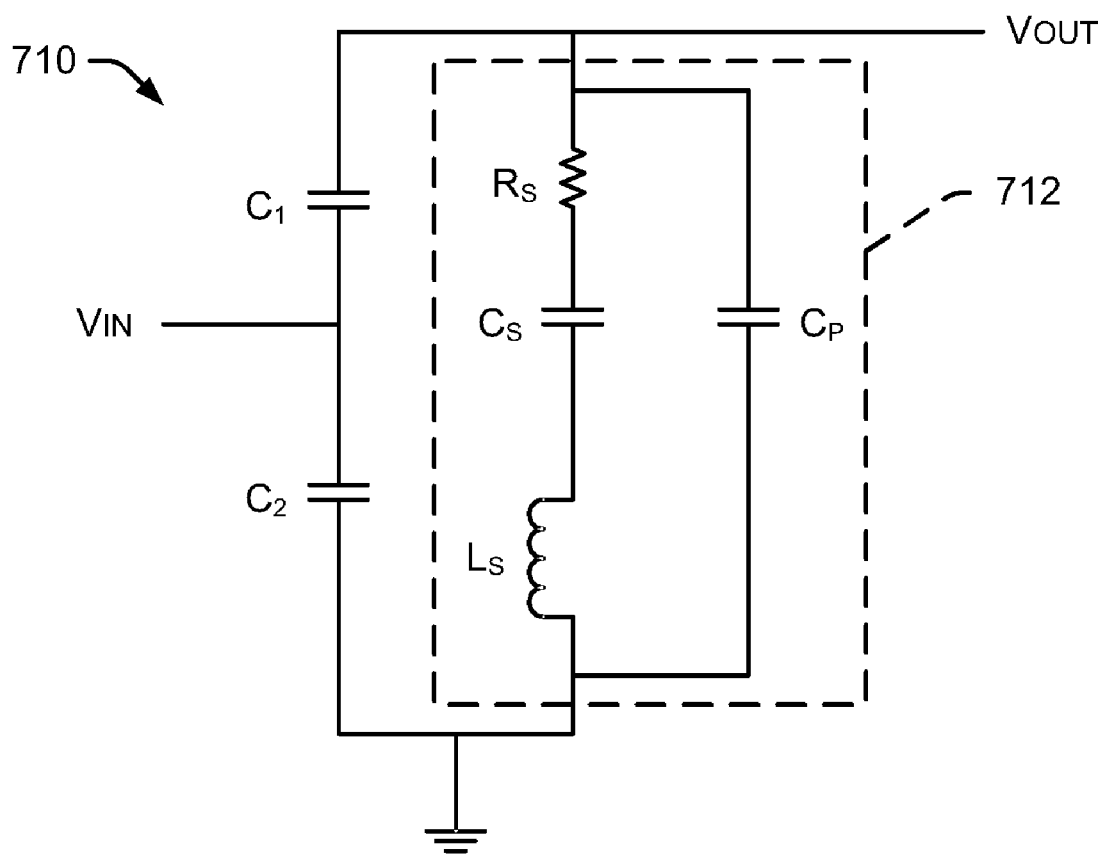
Figure 7F:
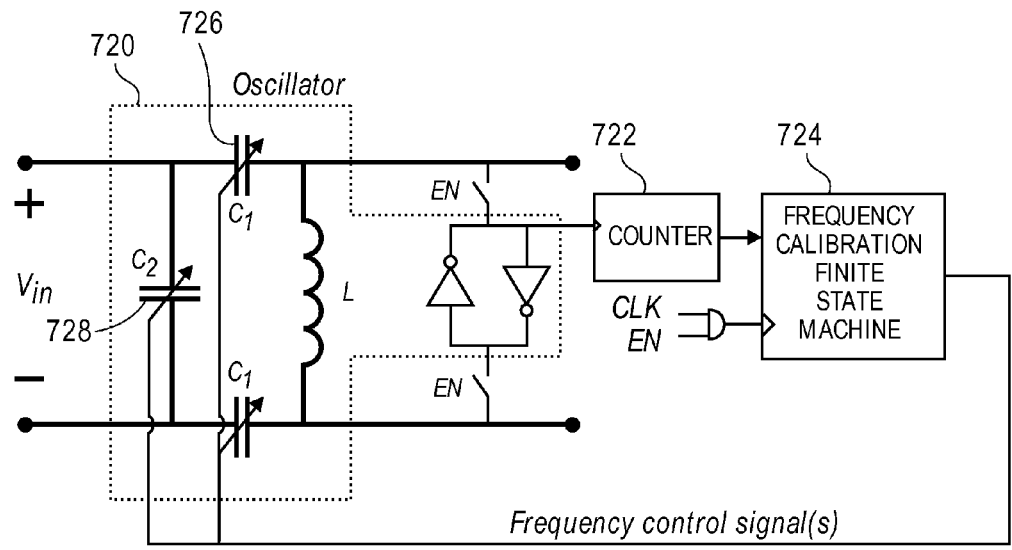

FIG. 7E illustrates an embodiment of a circuit 710 referred to as a tapped capacitor electromechanical resonator. Circuit 710 has a single-ended input (Vin) and a single-ended output (Vout), is a tuned resonator, and is capable of significant voltage gain. Circuit 710 has two resonant modes—a series resonant mode and a parallel resonant mode. The passband for circuit 710 is centered at the parallel resonant mode of the circuit, where the voltage gain can be achieved. The parallel resonance is a slightly higher frequency than the series resonance. The series resonance is determined by the values of $L_S$ and $C_S$ and the parallel resonance is determined by the values of $L_S$, $C_S$, and $C_P$. Circuit 710 includes an electromechanical resonator 712. Capacitors $C_1$ and $C_2$ can be adjusted to tune the voltage gain of the network within the passband and may provide fine-trimming of the resonant frequency. Circuit 710 is particularly useful in narrowband or fixed frequency applications because its frequency is not widely tunable and it has a narrow and stable passband with steep rejection in the stopband.

When using input circuits that are widely tunable, such as those shown in FIGS. 7A and 7B, it is desirable to automatically detect and adjust the center frequency of the passband for optimal performance. In one embodiment shown in FIG. 7F, the center frequency is determined by creating an oscillation in the input circuit and counting the number of cycles of this oscillation that occur over a predetermined reference period of time, such as the period provided by a clock signal (CLK). The center frequency is then adjusted by enabling or disabling switched capacitors in the circuit until a desired cycle count for the reference period is obtained. The generation of this oscillation, its detection, and adjustment of its frequency are typically performed as an intermittent and offline calibration, such as when the receiver is not receiving data. During calibration, the active core of oscillator 720 connects across the resonant passive network causing an oscillation at its natural resonance. Counter 722 increments its digital output in proportion to the oscillator's frequency. A frequency calibration finite state machine 724 runs a calibration algorithm that iteratively compares the count value at time intervals established from the known frequency of the clock signal (CLK) and adjusts tunable capacitors 726 and 728 until it has converged to an acceptable frequency.

Figure 7G:
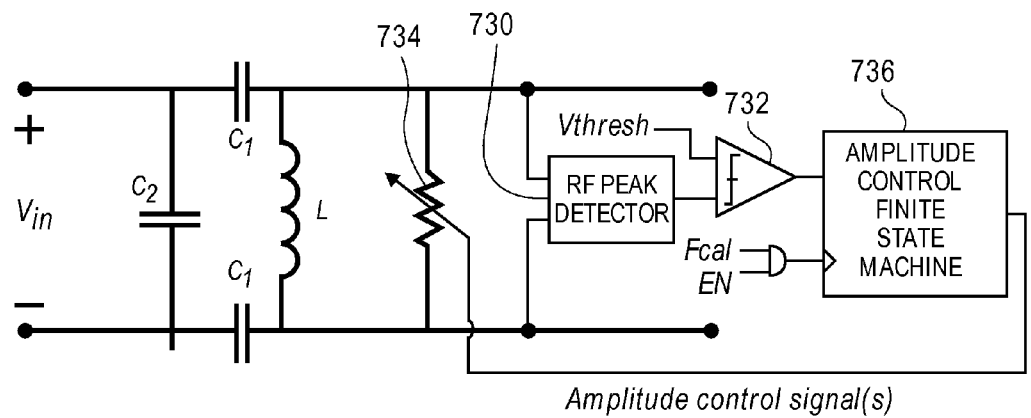

FIG. 7G depicts one embodiment of signal-strength measurement system 210 and gain control 204 components of FIG. 2. Their purpose is to control the passive voltage gain such the output signal voltage levels remain below a predetermined threshold set by linearity requirements. The detection of the peak voltage level of the output signal is typically performed as a short intermittent calibration, such as at the beginning of a receive operation. Peak voltage levels are measured using an RF peak detector 730 and compared to a desired maximum voltage level using an active voltage comparator 732. The gain of the passive receiver network, and thus signal amplitude levels at its output, are then adjusted by changing a resistor 734 connected across the passive resonant network. Lowering the resistance increases the loss of the passive network which effectively reduces its voltage gain. An amplitude control finite state machine 736 runs a calibration algorithm that iteratively adjusts the resistance based on the voltage comparator output until it has converged to an acceptable peak voltage level. The voltage gain of the resonant network shown in FIG. 7G could also be adjusted by varying the relative size of $C_1$ to $C_2$, although this method of gain tuning may cause variation in the center frequency of the network.

FIGS. 8A-10B depict several embodiments of a dynamic switching circuit and its associated sampling clock waveforms. The function of the dynamic switching circuit is to generate an output signal which is a frequency translated version of the signal it receives from the input circuit. The dynamic switching circuit may provide other signal processing functions, such as decimation, voltage gain, and discrete or continuous-time analog filtering. The dynamic switching circuit performs these functions using one or more switches and/or capacitors (including implicit or explicit). The switches are enabled and disabled by signals generated by the switch signal generator. In a particular embodiment, the dynamic switching circuit is implemented in an integrated circuit where the switches are implemented with NMOS (negative-channel metal-oxide semiconductor) or PMOS (positive-channel metal-oxide semiconductor) FETs (field-effect transistors), or a combination of NMOS and PMOS, and the capacitors are implemented using integrated metal plate capacitors.

Figure 8A:
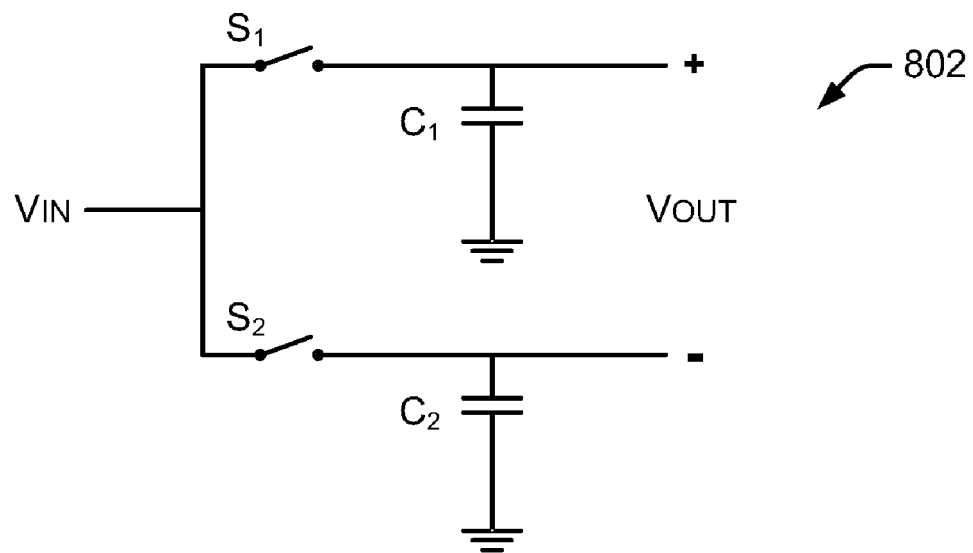
FIGS. 8A-10D depict several embodiments of dynamic switching circuits and associated clock waveforms that drive the dynamic switching circuits.
Figure 8B:
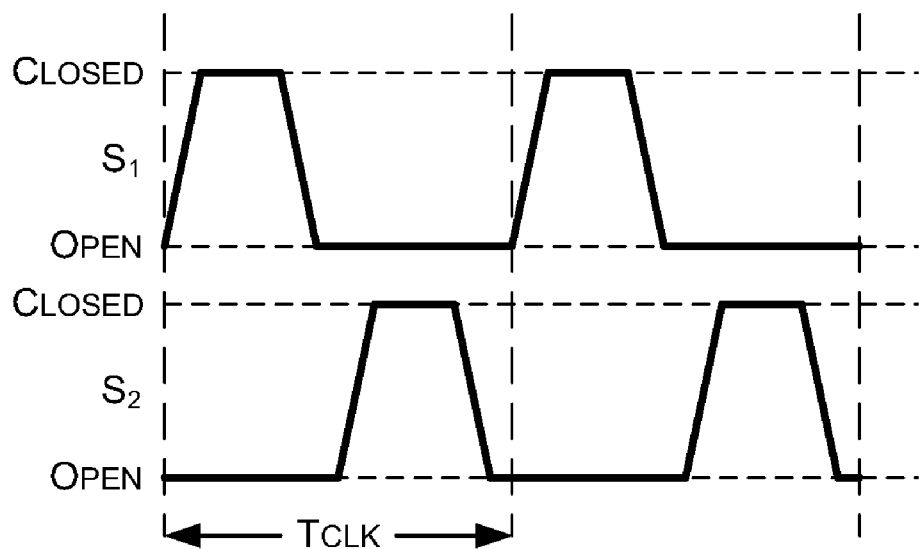

FIG. 8A illustrates an embodiment of a passive switching mixer circuit 802. Circuit 802 has a single-ended input (Vin) and a differential output (Vout). The circuit uses two switches, driven by waveforms labeled $S_1$ and $S_2$, and two capacitors, $C_1$ and $C_2$. The sampling frequency of circuit 802 is represented by $f_{clk}$, which is calculated according to the following formula:

$$f_{clk} = 1/T_{clk}$$

where $T_{clk}$ is the time associated with one cycle. Circuit 802 translates the spectrum of frequencies surrounding the sampling frequency $f_{clk}$ to a spectrum centered at 0 Hz. As shown in FIG. 8B, two samples are obtained every $T_{clk}$ and the output of circuit 802 is the difference between the samples on capacitors $C_1$ and $C_2$. The sampling operation is band limited due to the impedance of the source and the capacitance at the output. As a result, signals farther from the sampling frequency will have less voltage gain to the output. The sampling clock waveforms shown in FIG. 8B are non-overlapping and cause the switches to open and close. To avoid performance degradation, circuit 802 requires that $S_1$ and $S_2$ be non-overlapping waveforms. Overlap of $S_1$ and $S_2$ effectively creates a short between the two independent samples stored on capacitors $C_1$ and $C_2$, thereby reducing the output signal amplitude. Hence, the duty-cycle (D) of $S_1$ and $S_2$ should be kept below ½ to avoid overlap.

FIG. 8C illustrates an embodiment of a passive switching mixer circuit 810 with resistances added to facilitate an approximate model for describing the voltage gain and noise performance of the circuit. The input of circuit 810 is driven by a voltage source with a source resistance ($R_S$), and the switches of the mixer each include a series resistance ($R_{SW}$), to model the "on-resistance" of the switch. Circuit 810 typically provides a voltage gain of up to 6 dB, depending upon the value of D associated with driving waveforms $S_1$ and $S_2$, as shown in FIG. 8D. The voltage gain ($A_v$) of circuit 810 is approximately described by a sinc function where D is the duty cycle of $S_1$ and $S_2$. Hence, $A_v$ is substantially independent of the resistance of its constituent switches and the amplitude of driving waveforms $S_1$ and $S_2$. $A_v$ reaches its maximum value of 2 V/V (or 6 dB) as D approaches zero, and $A_v$ approaches a minimum value of $2/\pi$ as D approaches ½.

$$A_v = 2 \cdot \frac{\sin \pi D}{\pi D}$$

The noise performance of circuit 810 is dependent on both $R_{SW}$ and $R_S$. The total output noise density (in V²/Hz) of passive mixer 810 is given by the following formula:

$$\frac{V_n^2}{\text{Hz}} = 4kT \frac{R_S + R_{SW}}{2D}$$

The noise factor (F) of circuit 810 is given by the following equation:

$$F = \frac{R_S + R_{SW}}{R_S} \cdot \frac{1}{2D} \cdot \left(\frac{\pi D}{\sin \pi D}\right)^2 \quad 0 \leq D \leq \frac{1}{2}$$

The noise factor (F) of circuit 810 is minimized when D=0.375. The basic voltage gain and noise performance tradeoffs associated with circuit 810 are captured by the previous three equations involving $R_S$, $R_{SW}$, and D. Noise factor is minimized by appropriate choice of D and by making $R_{SW}$ much smaller than $R_S$. Hence, the combination of a high source resistance and a low switch resistance is helpful for reducing noise factor. In particular, the reduction of switch resistance as technology scales brings continuing improvement of noise performance. Other passive switching mixer topologies described herein feature analogous tradeoffs.

When circuit 810 is driven directly by an antenna with a real impedance, then $R_S$ can be set equal to the antenna impedance in the previous two equations. Alternatively, if the input of the passive mixer is driven by a resonant LC network with a center frequency tuned to $f_{clk}$ then $R_S$ can be approximated by the real part of the output impedance of the LC network at resonance.

Figure 9A:
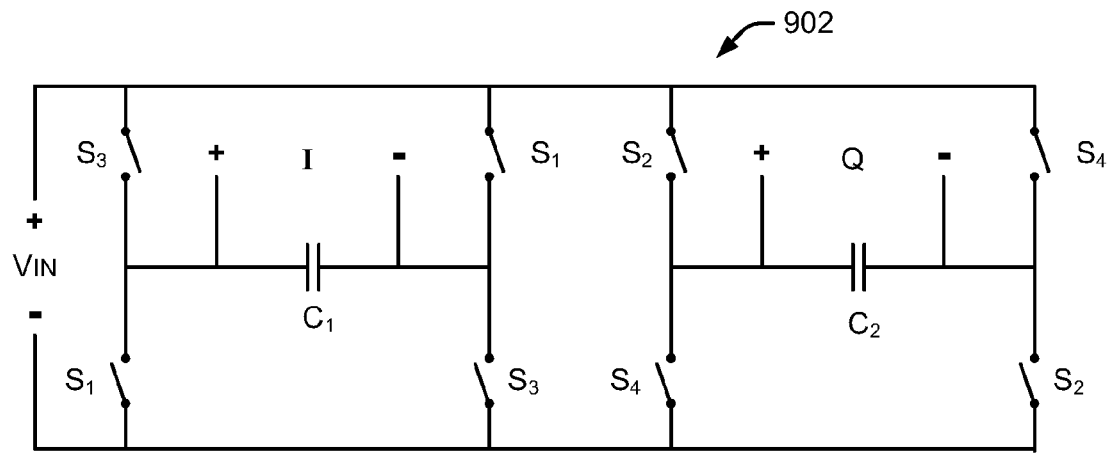

FIG. 9A illustrates an embodiment of a passive switching mixer circuit 902 with complex outputs. Circuit 902 has a differential input (Vin) and a differential output (Vout). The circuit includes two differential input/output mixers—one labeled "I" and one labeled "Q". The sampling frequency of circuit 902 is $f_{clk}$ and four samples are obtained every $T_{clk}$ to provide the complex outputs I and Q. Output I is commonly referred to as the "real output signal" and output Q is commonly referred to as the "imaginary output signal". Output I is measured across capacitor $C_1$ and output Q is measured across capacitor $C_2$.

Figure 9B:
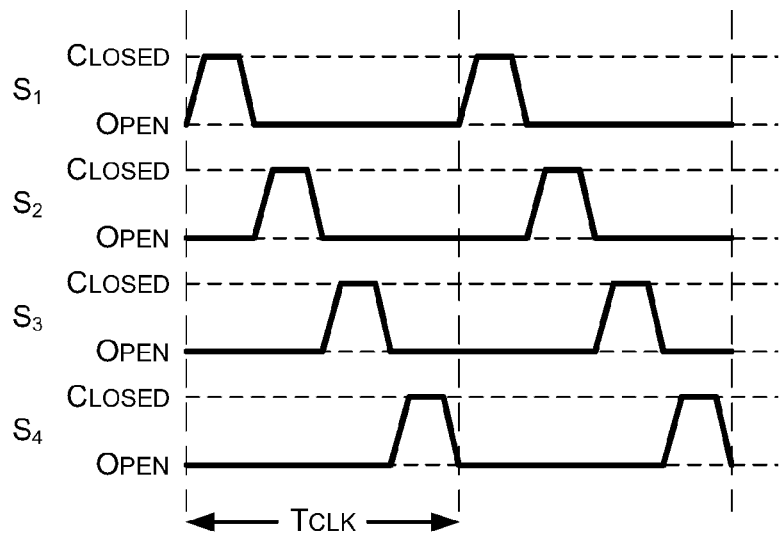

Since circuit 902 has a differential input and output, the circuit is substantially immune to common-mode interference appearing at the input or arising from other sources (e.g., substrate noise). Additionally, circuit 902 can tolerate input signals with up to twice the voltage amplitude of the circuit shown in FIG. 8A without introducing significant nonlinear distortion. Circuit 902 is also capable of achieving lower noise factor than circuit 802 due to the generation of complex outputs I and Q having a combined signal-to-noise ratio (SNR) that is approximately 3 dB higher than that of each individual signal. However, the maximum voltage gain of circuit 902 is limited to 0 dB. FIG. 9B illustrates four sampling clock waveforms, labeled $S_1$, $S_2$, $S_3$, and $S_4$ that control the eight switches in circuit 902. The four sampling clock waveforms shown in FIG. 9B are non-overlapping to prevent degradation of the performance of circuit 902. Because circuit 902 uses four non-overlapping phases, the duty cycle (D) should be less than ¼.

Figure 10B:
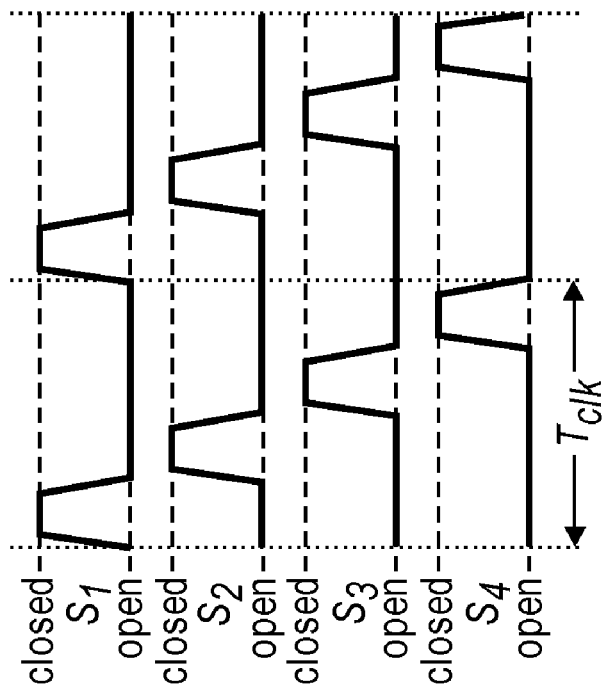
Figure 10A:
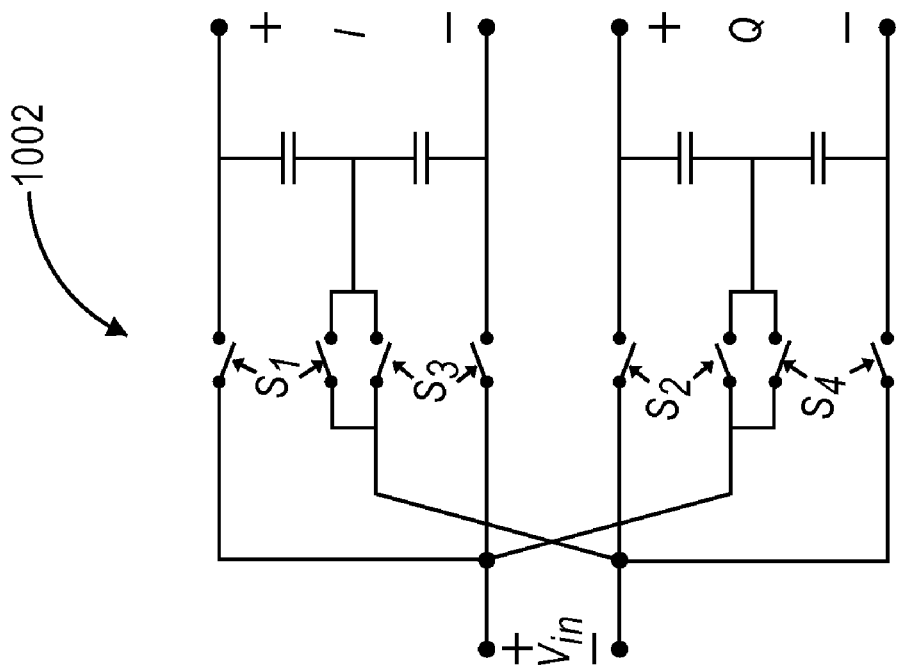

FIG. 10A illustrates an embodiment of a passive mixer circuit 1002 with complex outputs and positive passive voltage gain. Circuit 1002 has a differential input signal (Vin) and a differential output signal. The sampling frequency of circuit 1002 is $f_{clk}$ and four samples are obtained every $T_{clk}$ to provide the complex outputs I and Q. FIG. 10B illustrates four sampling clock waveforms, labeled $S_1$, $S_2$, $S_3$, and $S_4$, that control the eight switches in circuit 1002. The four sampling clock waveforms shown in FIG. 10B are non-overlapping to prevent degradation of the performance of circuit 1002. Because circuit 1002 uses four non-overlapping phases, the duty cycle (D) should be less than ¼. Similar to circuit 902, circuit 1002 provides the benefits of immunity to common mode interference and low implementation complexity, but has the added benefit of positive voltage gain of up to 6 dB. The positive voltage gain of circuit 1002 arises from the fact that samples collected on each phase of the clock are stored on separate capacitors, arranged such that the output of the circuit is the continuous-time voltage summation of the two samples collected on each respective path (e.g., I and Q). Hence, the I output is the voltage sum of samples collected during phases $S_1$ and $S_3$, while the Q output is the sum of samples collected during phases $S_2$ and $S_4$.

Figure 10D:
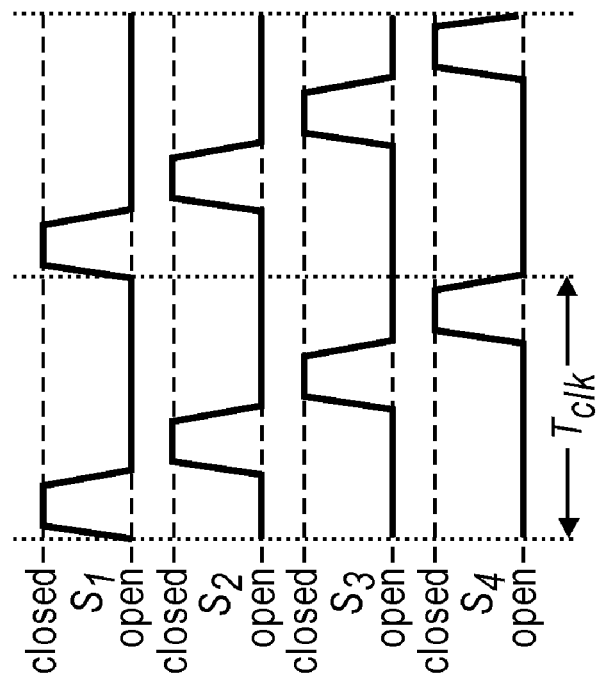
Figure 10C:
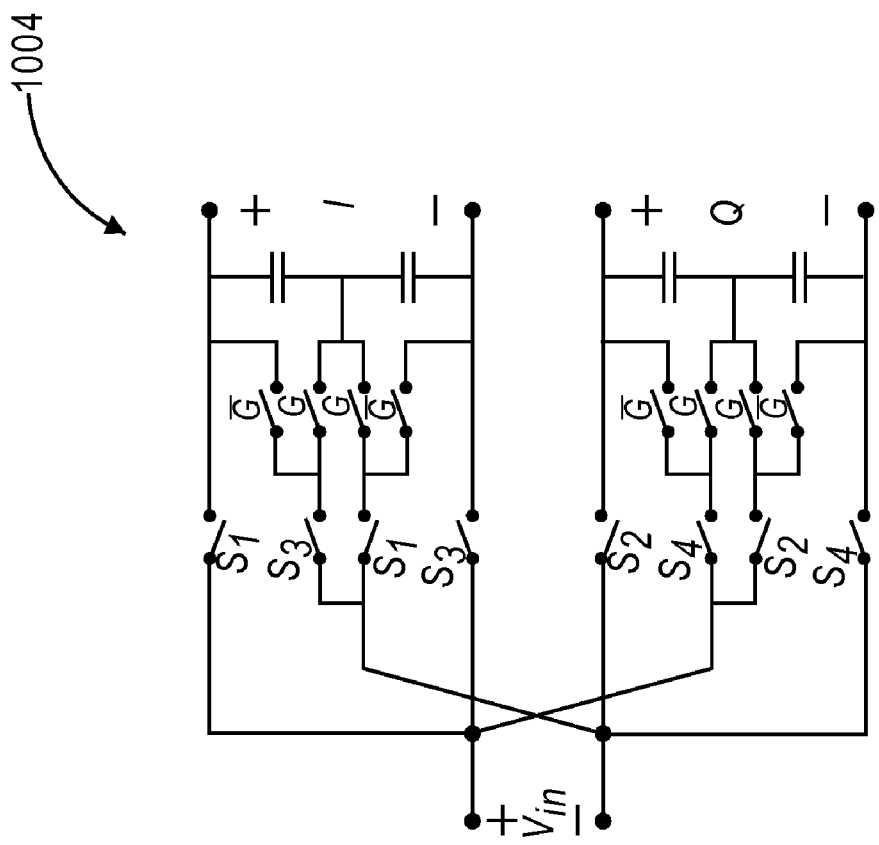

FIG. 10C illustrates an embodiment of a passive mixer circuit 1004 with complex outputs and programmable voltage gain. Circuit 1004 provides two modes of operation, depending on the state of the input control signal labeled G. When G is high (e.g., Gbar is low), then circuit 1004 is configured to be functionally equivalent to circuit 1002 (FIG. 10A), providing up to 6 dB of positive voltage gain. When G is low (e.g., Gbar is high), then circuit 1004 is configured to be functionally equivalent to circuit 902 (FIG. 9A), providing a maximum of 0 dB voltage gain. The inclusion of gain programmability in passive mixer circuit 1004 may improve receiver dynamic range. FIG. 10D illustrates four sampling clock waveforms, labeled $S_1$, $S_2$, $S_3$, and $S_4$, that control eight switches in circuit 1004.

Figure 11:
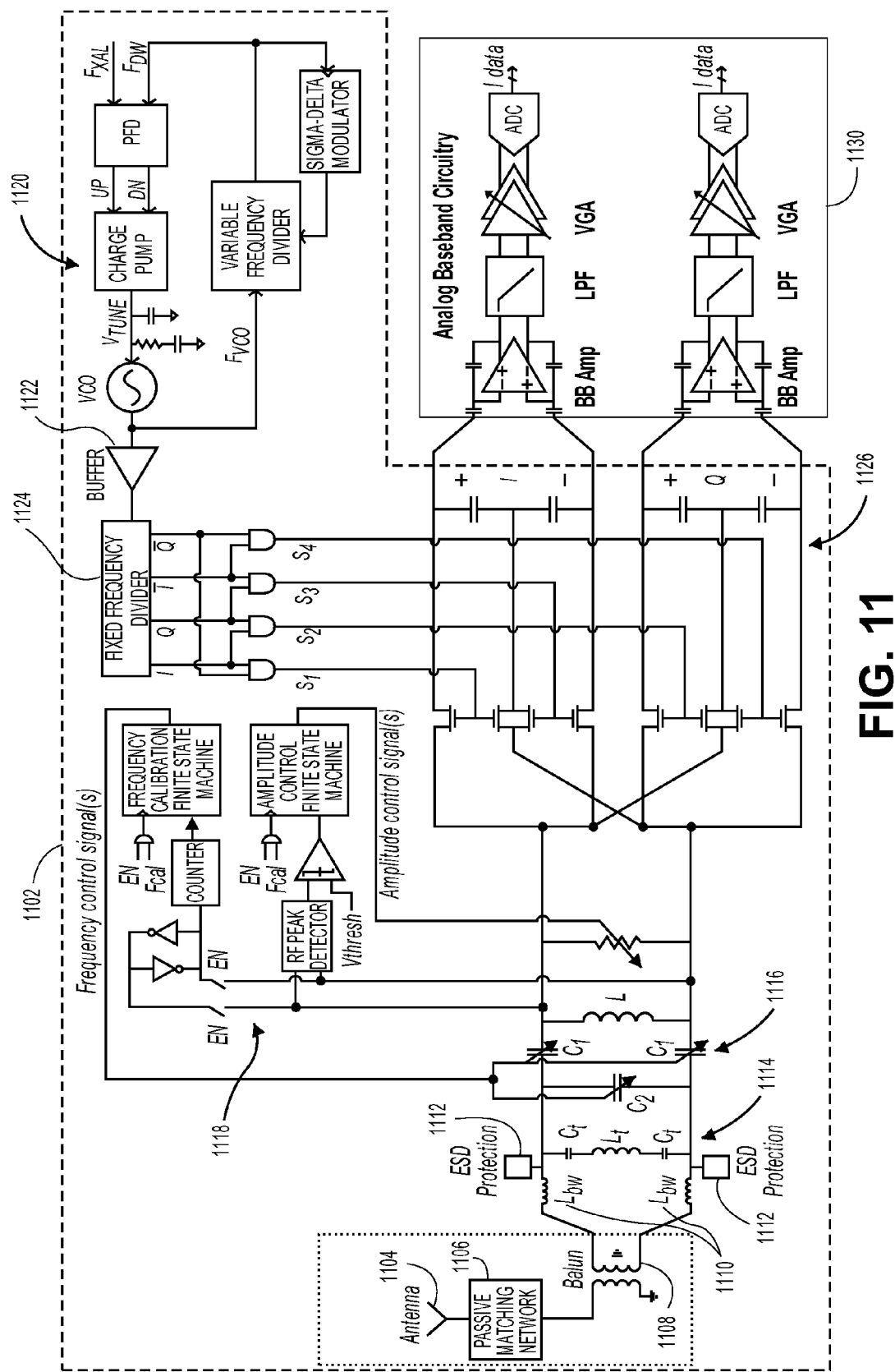
FIG. 11 depicts an embodiment of a passive wireless receiver amenable to integration within a CMOS integrated circuit.

FIG. 11 illustrates an embodiment of a passive wireless receiver amenable to integration within a CMOS (Complementary Metal Oxide Semiconductor) integrated circuit. The area within the dashed outline 1102 represents the various components and circuits described herein.

The various components and circuits described herein are represented in FIG. 11 (e.g., the passive input circuit, the dynamic switching circuit, and the switch signal generator). In the embodiment of FIG. 11, the passive input circuit includes a passive matching network 1106, a balun 1108, a parasitic bondwire inductor 1110 (Lbw), Electro Static Discharge (ESD) elements 1112, a differential LC trap 1114 (Lt and Ct), a differential tapped capacitor resonator 1116 and automatic frequency calibration and amplitude control loops 1118.

Matching network 1106 facilitates impedance matching requirements between antenna 1104 and balun 1108. Balun 1108 provides accurate single-ended input to differential output signal conversion and may also provide substantial rejection of unwanted out-of-band RF signals. Parasitic bondwire inductors 1110 are explicitly shown as they affect the characteristics of the overall passive network. ESD protection elements 1112 prevent electro-static discharge events from causing permanent damage to devices in the integrated circuit. ESD protection elements 1112 appear as additional capacitance (and loss to a minor extent) increasing the overall value of C2. Differential LC trap 1114 provides rejection to unwanted RF signals in the vicinity of its natural resonant frequency. Since the LC trap resonant frequency is set to resonate higher than the desired RF signal band, it effectively appears as additional capacitance increasing the overall value of C2 (at frequencies near the desired RF signal band). Differential tapped capacitor resonator 1116 provides substantial RF voltage gain, low noise figure, high selectivity, and high linearity. Automatic frequency calibration and amplitude control loops 1118 provide accurate control of the passive network resonant frequency and gain, thereby providing robustness and improved performance of the passive input circuit in terms of gain, selectivity, and linearity. The switch signal generator illustrated in FIG. 11 comprises phase-locked loop 1120, buffer 1122, fixed frequency divider 1124 and waveform shaping circuit 1126. As previously described and illustrated in FIG. 5D, the switch signal generator produces four non-overlapping pulses with a quadrature phase relationship to drive the dynamic switching circuit. The dynamic switching circuit shown in FIG. 11 is an NMOS implementation of circuit 1002, described previously. Block 1130 shown in FIG. 11 represents one particular implementation of conventional analog baseband circuitry that may be used to process and digitize the output signal of the passive wireless receiver system.

The passive wireless receiver shown in FIG. 11 achieves substantial RF gain, high linearity, low-noise, frequency translation via the dynamic switching circuit, and filtering at the output of the dynamic switching circuit, all with a passive signal path originating from the antenna at the receiver input and continuing up to the output of the dynamic switching circuit.

Embodiments of the system and method described herein facilitate a lower power system implementation compared to conventional receiver systems while providing similar functionality and performance (e.g., noise figure, dynamic range, interference immunity, etc.). The achievable sensitivity is limited by the loss introduced by the switches and other passive components, which may be well controlled during manufacturing. Furthermore, the loss introduced by the CMOS switches and the power consumption required to activate and deactivate them diminishes as their channel length shrinks due to technology scaling. The achievable linearity, as measured by IP3 and $P_{1\,dB}$, of the passive wireless receiver may be limited primarily by the amplitude of the switching signals that drive the dynamic switching circuit, and may be vastly superior to that of conventional receivers which use inherently nonlinear active components to amplify and/or translate the frequency of the RF signal. Furthermore, due to the passive nature of the signal path, the achievable dynamic range of the passive wireless receiver is substantially decoupled from the system power consumption, unlike conventional receiver systems. Additionally, some embodiments may be used in conjunction with one or more conventional signal processing techniques. For example, one embodiment may include a passive wireless receiver system described herein followed by conventional low-frequency components that provide baseband signal processing. The additional power consumption of conventional baseband circuitry following the passive wireless receiver is minimal, due to their low frequency of operation and the fact that their impact on the system noise figure is reduced by the square of the voltage gain provided by the passive wireless receiver system.

Although the components and modules illustrated herein are shown and described in a particular arrangement, the arrangement of components and modules may be altered to process signals in a different manner. In other embodiments, one or more additional components or modules may be added to the described systems, and one or more components or modules may be removed from the described systems. Alternate embodiments may combine two or more of the described components or modules into a single component or module.

Although specific embodiments of the invention have been described and illustrated, the invention is not to be limited to the specific forms or arrangements of parts so described and illustrated. The scope of the invention is to be defined by the claims appended hereto and their equivalents.

The invention claimed is:

1. A wireless receiver system that performs passive signal processing and delivers an output whose power is substantially composed of power received in an input signal, the wireless receiver system comprising:
    an input circuit configured to receive the input signal and produce a first output signal, the input circuit including a passive network configured to condition the input signal;
    a dynamic switching circuit configured to perform frequency translation on the first output signal, wherein the dynamic switching circuit includes a plurality of sampling switches; and
    a switch signal generator configured to drive the dynamic switching circuit to activate and deactivate the plurality of sampling switches of the dynamic switching circuit at a sampling frequency that is controlled and stabilized by a frequency control circuit.

2. The wireless receiver system of claim 1, wherein the passive network includes a resonant circuit configured to condition a received input signal prior to processing by the dynamic switching circuit.

3. The wireless receiver system of claim 2, wherein a resonant circuit is chosen from the group including: networks using inductors, capacitors and resistors that may be on-chip, off-chip, or resulting from an interface between the resonant circuit and its external environment, an on-chip or off-chip electromechanical component, an electromagnetic resonator, an electromagnetic radiator, a tuned antenna, and an on-chip or off-chip transmission line network.

4. The wireless receiver system of claim 1, wherein the passive network includes a balun circuit configured to condition a received input signal prior to processing by the dynamic switching circuit.

5. The wireless receiver system of claim 4, wherein a balun circuit is chosen from the group including: networks using inductors, capacitors and resistors that may be on-chip, off-chip, or resulting from an interface between the balun circuit and its external environment, an on-chip or off-chip transmission line network, on-chip or off-chip magnetically coupled coils, a surface acoustic wave device, and a ceramic device.

6. The wireless receiver system of claim 1, wherein the passive network includes one of a ceramic circuit, resonant balun circuit, non-resonant balun circuit, and surface acoustic wave filter configured to condition a received input signal prior to processing by the dynamic switching circuit.

7. The wireless receiver system of claim 1, wherein the passive network includes a matching network configured to condition a received input signal prior to processing by the dynamic switching circuit.

8. The wireless receiver system of claim 7, wherein a matching network is chosen from the group including: networks using inductors, capacitors and resistors that may be on-chip, off-chip, or resulting from an interface between the matching network and its external environment, an on-chip or off-chip transmission line network.

9. The wireless receiver system of claim 1, wherein the input signal power is captured by an antenna.

10. The wireless receiver system of claim 1, wherein the passive network is configured to provide voltage gain.

11. The wireless receiver system of claim 1, wherein the passive network is configured to provide frequency selectivity.

12. The wireless receiver system of claim 1, wherein the passive network is configured to provide single-ended-to-differential signal conversion.

13. The wireless receiver system of claim 1, wherein the passive network is configured to provide impedance matching.

14. The wireless receiver system of claim 1, wherein the passive network is configured to provide impedance transformation.

15. The wireless receiver system of claim 1, further comprising a frequency calibration circuit configured to adjust the frequency response of the passive network to improve performance.

16. The wireless receiver system of claim 1, further comprising a gain control circuit configured to adjust the signal voltage gain of the passive network to improve performance.

17. The wireless receiver system of claim 1, wherein the dynamic switching circuit is a switching analog circuit block configured to sample the output signal of the input circuit and to perform passive signal processing and frequency translation.

18. The wireless receiver system of claim 1, wherein the switch signal generator is configured to set the sampling frequency associated with the dynamic switching circuit.

19. The wireless receiver system of claim 1, wherein the frequency control circuit is an automatic frequency synthesizer configured to control the sampling frequency of the dynamic switching circuit.

20. The wireless receiver system of claim 1, wherein the switch signal generator further includes:
a automatic frequency synthesizer circuit configured to control a variable oscillator to provide a variable oscillator output signal;
a waveform shaping circuit configured to condition the first output signal; and
an isolation circuit configured to isolate the variable oscillator from the waveform shaping circuit and other interfering signals present at the input of the dynamic switching circuit.

21. The wireless receiver system of claim 1, wherein the dynamic switching circuit is configured to perform analog signal processing.

22. The wireless receiver system of claim 1, wherein the dynamic switching circuit is configured to perform signal filtering.

23. The wireless receiver system of claim 1, wherein the dynamic switching circuit is configured to perform signal summation.

24. The wireless receiver system of claim 1, wherein the dynamic switching circuit is configured to perform signal decimation.

25. The wireless receiver system of claim 1, wherein the dynamic switching circuit is configured to provide programmable voltage gain.

26. The wireless receiver system of claim 1, wherein the switching in the dynamic switching circuit is performed substantially using switches and capacitors.

27. The wireless receiver system of claim 1, wherein the input circuit is further configured to operate with frequency and gain control.

28. The wireless receiver system of claim 1, wherein the switch signal generator is further configured to operate with substantial resistance to corruption due to parasitic coupling of input signals.

29. The wireless receiver system of claim 1, wherein the switch signal generator is further configured to operate with waveform shaping and timing to substantially prevent overlap between phases.

30. A wireless receiver comprising:
an input circuit configured to receive an input signal and produce a first output signal, the input circuit including a passive network configured to condition the input signal, the passive network including a resonant circuit chosen from the group including: networks using inductors, capacitors and resistors that may be on-chip, off-chip, or resulting from an interface between the resonant circuit and its external environment, an on-chip or off-chip electromechanical component, an electromagnetic resonator, an electromagnetic radiator, a tuned antenna, and an on-chip or off-chip transmission line network;
a dynamic switching circuit configured to perform frequency translation on the first output signal, wherein the dynamic switching circuit includes a plurality of sampling switches; and
a switch signal generator configured to drive the dynamic switching circuit to activate and deactivate the plurality of sampling switches of the dynamic switching circuit at a sampling frequency that is controlled and stabilized by a frequency control circuit.

31. The wireless receiver of claim 30, wherein the passive network is configured to provide voltage gain.

32. The wireless receiver of claim 30, wherein the passive network is configured to provide frequency selectivity.

33. The wireless receiver of claim 30, wherein the passive network is configured to provide single-ended-to-differential signal conversion.

34. The wireless receiver of claim 30, wherein the passive network is configured to provide impedance matching.

35. A method comprising:
receiving a wireless signal;
processing the wireless signal using a passive network, wherein processing the wireless signal includes conditioning the wireless signal;
generating a first output signal based on the conditioned wireless signal;
generating a plurality of control signals that control a plurality of sampling switches of a dynamic switching circuit at a sampling frequency;
stabilizing the plurality of control signals;
processing the first output signal to perform frequency translation on the first output signal and generate a second output signal; and
applying the plurality of control signals to the dynamic switching circuit to activate and deactivate the plurality of sampling switches of the dynamic switching circuit.

36. The method of claim 35, wherein processing the wireless signal includes providing voltage gain to the wireless signal.

37. The method of claim 35, wherein processing the wireless signal includes providing frequency selectivity to the wireless signal.

38. A wireless receiver system that performs passive signal processing and delivers an output whose power is substantially composed of power received in an input signal, the wireless receiver system comprising:
an input circuit configured to receive the input signal and produce an output signal, the input circuit including a passive network configured to condition the input signal;
a dynamic switching circuit configured to perform frequency translation on the output signal, wherein the dynamic switching circuit is a switching analog circuit block configured to sample the output signal of the input circuit and to perform passive signal processing and frequency translation; and
a switch signal generator configured to drive the dynamic switching circuit to activate and deactivate the dynamic switching circuit at a sampling frequency that is controlled and stabilized by a frequency control circuit.

39. A wireless receiver system that performs passive signal processing and delivers an output whose power is substantially composed of power received in an input signal, the wireless receiver system comprising:
an input circuit configured to receive the input signal and produce an output signal, the input circuit including a passive network configured to condition the input signal;
a dynamic switching circuit configured to perform frequency translation on the output signal, and wherein the dynamic switching circuit is configured to perform signal filtering; and
a switch signal generator configured to drive the dynamic switching circuit to activate and deactivate the dynamic switching circuit at a sampling frequency that is controlled and stabilized by a frequency control circuit.

40. A wireless receiver system that performs passive signal processing and delivers an output whose power is substantially composed of power received in an input signal, the wireless receiver system comprising:

an input circuit configured to receive the input signal and produce an output signal, the input circuit including a passive network configured to condition the input signal;

a dynamic switching circuit configured to perform frequency translation on the output signal, and wherein the dynamic switching circuit is configured to provide programmable voltage gain; and a switch signal generator configured to drive the dynamic switching circuit to activate and deactivate the dynamic switching circuit at a sampling frequency that is controlled and stabilized by a frequency control circuit.

* * * * *